(12) United States Patent
Evers

(10) Patent No.: US 6,211,053 B1
(45) Date of Patent: *Apr. 3, 2001

(54) LASER WIRE BONDING FOR WIRE EMBEDDED DIELECTRICS TO INTEGRATED CIRCUITS

(75) Inventor: Sven Evers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/344,678

(22) Filed: Jun. 25, 1999

Related U.S. Application Data

(60) Continuation of application No. 08/911,389, filed on Aug. 14, 1997, now Pat. No. 5,956,607, which is a division of application No. 08/654,192, filed on May 28, 1996, now Pat. No. 5,731,244.

(51) Int. Cl.[7] .................................................. H01L 21/44
(52) U.S. Cl. ..................... 438/617; 438/111; 219/121.63; 219/121.64
(58) Field of Search ..................... 438/612, 617, 438/613, 111, 112; 214/121.65, 121.64

(56) References Cited

U.S. PATENT DOCUMENTS

| | | |
|---|---|---|
| 3,610,874 | 10/1971 | Gagliano . |
| 4,534,811 | 8/1985 | Ainslie et al. . |
| 4,600,138 | 7/1986 | Hill . |
| 4,649,415 | 3/1987 | Hebert . |
| 4,684,781 | 8/1987 | Frish et al. . |
| 4,845,335 | 7/1989 | Andrews et al. . |
| 4,845,354 | 7/1989 | Gupta et al. . |
| 4,893,742 | 1/1990 | Bullock . |
| 4,926,022 | 5/1990 | Freedman . |
| 4,928,384 | 5/1990 | Gurevich . |
| 4,978,835 | 12/1990 | Luijtjes et al. . |
| 5,025,114 | 6/1991 | Braden . |
| 5,049,718 | 9/1991 | Spletter et al. . |
| 5,052,102 | 10/1991 | Fong et al. . |
| 5,083,007 | 1/1992 | Spletter et al. . |
| 5,150,198 | 9/1992 | Ohiketa et al. . |
| 5,194,710 | 3/1993 | McDaniel et al. . |
| 5,227,604 | 7/1993 | Freedman . |
| 5,251,805 | 10/1993 | Tani et al. . |
| 5,263,246 | 11/1993 | Aoki . |
| 5,274,210 | 12/1993 | Freedman et al. . |
| 5,302,801 | 4/1994 | Kanda et al. . |
| 5,366,692 | 11/1994 | Ogashiwa . |
| 5,483,100 | 1/1996 | Morris et al. . |
| 5,514,912 | 5/1996 | Ogashiwa . |
| 5,559,054 | 9/1996 | Adamjec . |
| 5,578,869 | 11/1996 | Hoffman et al. . |
| 5,629,835 | 5/1997 | Mchuliker et al. . |
| 5,668,405 | 9/1997 | Yamashita . |
| 5,770,888 | 6/1998 | Song et al. . |
| 5,956,607 | * 9/1999 | Evers ..................................... 438/617 |

* cited by examiner

*Primary Examiner*—Kevin M. Picardat
(74) *Attorney, Agent, or Firm*—Trask Britt

(57) ABSTRACT

A method and apparatus for connecting a lead of a lead frame to a contact pad of a semiconductor chip using a laser or other energy beam is herein disclosed. The lead may be wire bonded to the contact pad by heating the ends of a wire until the wire fuses to the contact pad and lead or an energy-fusible, electrically-conductive material may be used to bond the ends of the wire to the contact pad and lead. In addition, this invention has utility for both conventional lead frame/semiconductor chip configurations and lead-over-chip configurations. In addition, with a lead-over-chip configuration, the lead may be directly bonded to the contact pad with a conductive material disposed between the lead and the contact pad.

44 Claims, 6 Drawing Sheets

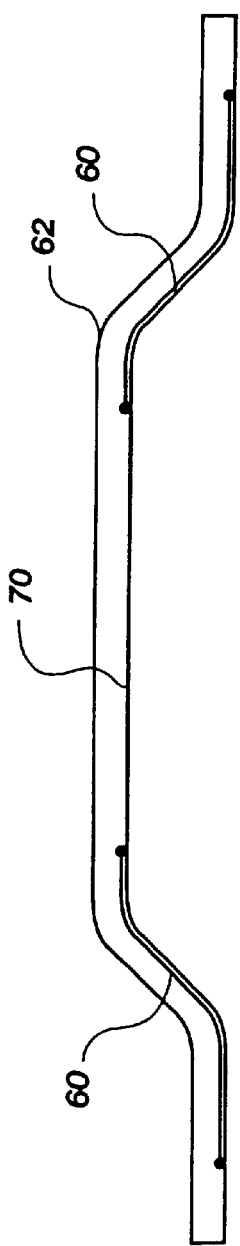
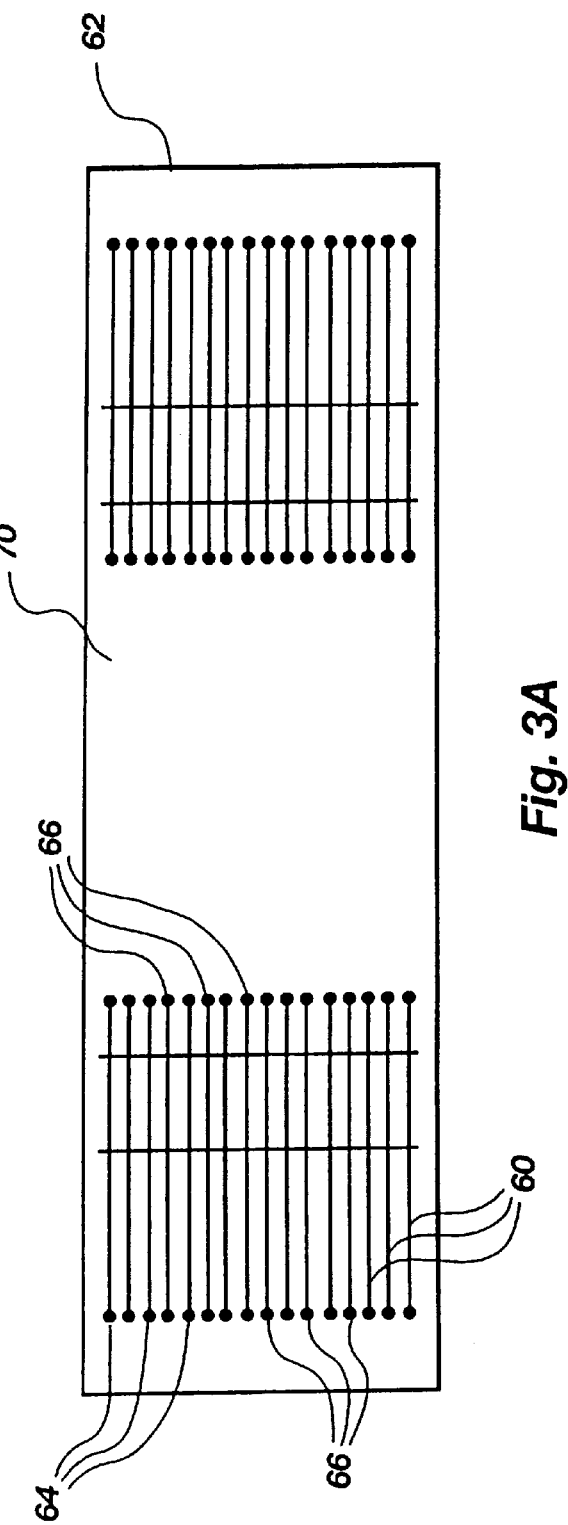
Fig. 3B
Fig. 3A

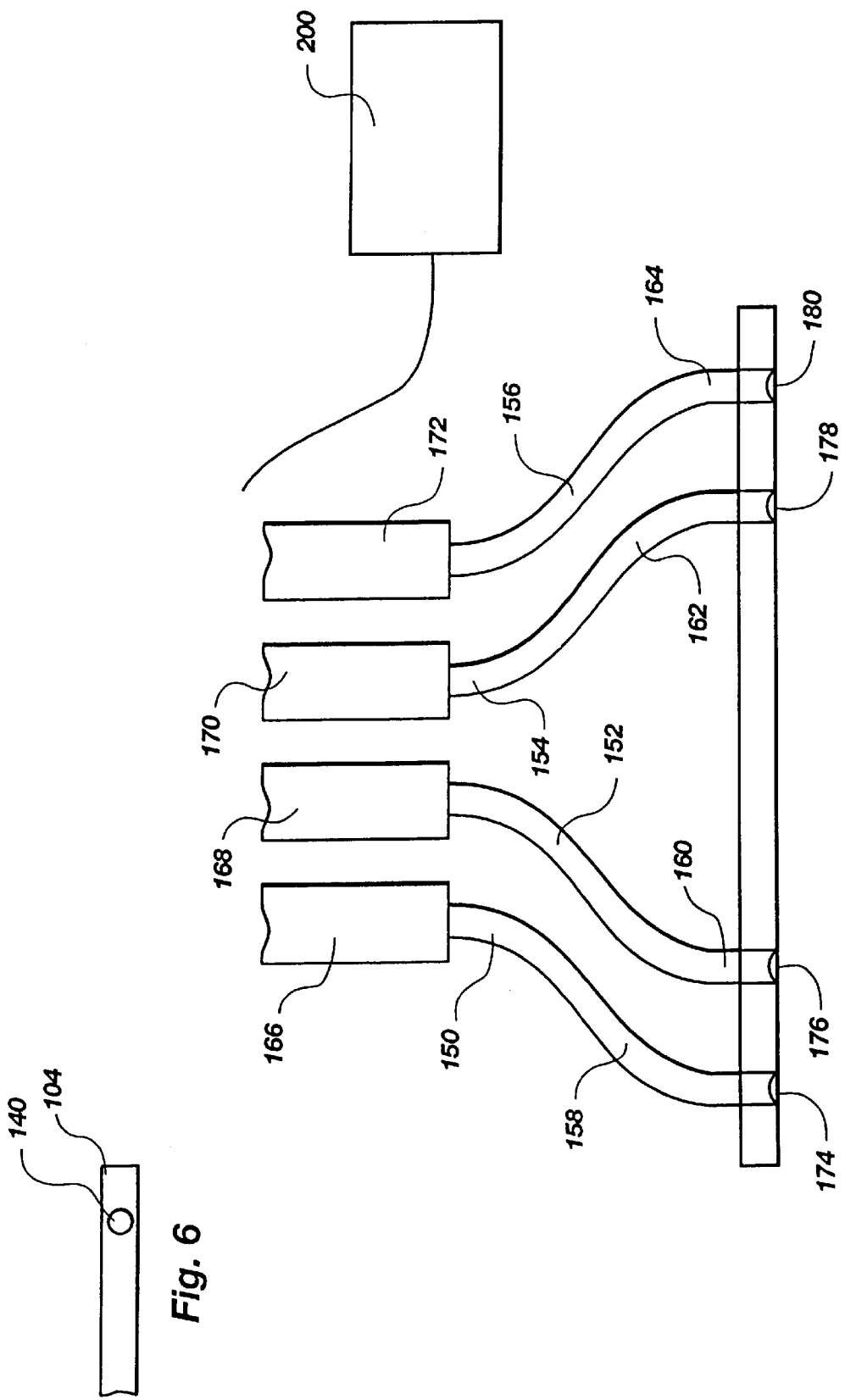

LASER WIRE BONDING FOR WIRE EMBEDDED DIELECTRICS TO INTEGRATED CIRCUITS

CROSS REFERENCE TO RELATED APPLICATION

This application is a continuation of application Ser. No. 08/911,389, filed Aug. 14, 1997, now U.S. Pat. No. 5,956,607, which is a divisional of application Ser. No. 08/654,192, filed May 28, 1996, now U.S. Pat. No. 5,731,244, issued Mar. 24, 1998.

BACKGROUND OF THE INVENTION

1. Field of the Invention

This invention relates generally to wire bonding lead frames to semiconductor dice and, more specifically, to wire bonding a lead frame to a semiconductor die using a laser beam to provide the energy necessary to bond or fuse a wire to a lead of a lead frame and to a contact pad of a semiconductor die. The method and apparatus of lead-to-chip bonding herein described is applicable to either a conventional lead frame and chip arrangement or a lead-over-chip (LOC) arrangement, in any instance, where the lead of a lead frame is directly or indirectly bonded to the contact pad of a semiconductor chip.

2. State of the Art

Various types of semiconductor chips are connected to lead frames and subsequently encapsulated in plastic for use in a wide variety of applications. A conventional lead frame is typically formed from a single continuous sheet of metal, typically by metal stamping operations. The conventional lead frame includes an outer supporting frame, a central semiconductor chip supporting pad and a plurality of leads, each lead having, in turn, a terminal bonding portion near the central chip supporting pad. Ultimately, the outer supporting frame of the lead frame is removed after the wire bonds between the contact pads of the semiconductor chip and the leads are made and the semiconductor chip and lead frame have been encapsulated.

In an LOC lead frame the lead frame has no central chip supporting pad with the semiconductor chip being held in position with respect to the lead frame and leads by means of adhesive strips secured to the leads of the lead frame and the semiconductor chip.

A typical apparatus and method for forming the wire bonds between the contact pads on a semiconductor chip and the leads of lead frames is illustrated in U.S. Pat. No. 4,600,138. As disclosed, a bond head is shown moving from a first bonding location to a second bonding location. The end of the wire is bonded to the first bonding location by the bond head. The bond head moves vertically away from the first bonding location to draw a length of wire necessary to make the wire bond. The bond head is then moved to the second bonding location with subsequent bonding of the wire to the second bonding location. The bond head is then used to pull and subsequently break away the remaining wire from the second bonding location. The bond head is then ready to be moved to another first bonding location for effecting another wire bond.

Typically, the bond head is heated to assist the formation of the wire bond. The heat and subsequent pressure applied by the bond head fuses the end of the wire to the contact pad. Ultrasonic vibration in conjunction with a heated bond head may also be used to affect a wire bond. Typically, there is a single bond head for making all of the wire bonds of the semiconductor chip. As should be recognized by those skilled in the art, such an operation is inherently mechanical in nature and thus limited to the speed of movement of the mechanical device.

One method of speeding up a conventional wire bonding process is to provide the heat necessary to effect a wire bond by utilizing heat generated from a laser beam to heat the bond head. Such apparatuses are disclosed in U.S. Pat. No. 4,534,811 to Ainslie et al., and U.S. Pat. No. 4,845,354 to Gupta et al. However, as the number of connections per semiconductor chip increase and the size of the leads decrease, such a bonding tool becomes impractical.

It has also been recognized in the art to use laser beams to form a lead-to-chip bond. For example, a method for reflowing solder to bond an electrical lead to a solder pad using a laser, in which the solder pad, rather than the terminal, is irradiated by the laser beam, is disclosed in U.S. Pat. No. 4,926,022 to Freedman. In addition, in U.S. Pat. No. 5,274,210 to Freedman et al., electrical connections may be made by coating conductive elements with a non-flux, non-metallic coating material making it possible to use a laser for bonding. The laser is either moved in a continuous sweep around all of the connections or pulsed.

It has also been recognized in the art to use a laser beam to bond the bumps of an integrated circuit to a tape automated bonding (TAB) tape lead. TAB, in general, has been one attempt in the art to increase the speed and efficiency of the chip-to-lead bonding process. For example, in U.S. Pat. No. 4,978,835 to Luijtjes et al. and U.S. Pat. No. 5,049,718 and U.S. Pat. No. 5,083,007 to Spletter et al., a laser beam is directed onto the ends of the leads of a TAB tape.

None of the previously mentioned prior art references, however, have successfully utilized laser light to reduce the mechanical limitations of the bonding process. More specifically, prior art devices either move the device relative to the laser for every bond, or a single laser beam to every bonding site. Thus, it would be advantageous to provide an apparatus and method for forming wire bonds using a laser in which the laser need not move for each bond and where more than one bond can be made substantially simultaneously.

SUMMARY OF THE INVENTION

Accordingly, the present invention provides a bonding apparatus and method of using the same for bonding any lead frame, either a conventional lead frame or a lead-over-chip (LOC) lead frame, to a semiconductor chip. Preferably, the semiconductor chip will include at least one contact pad on its active surface for providing an output, or input, as the case may be, of the chip. Likewise, the lead frame will include at least one lead to be connected to the contact pad of the chip. The chip/lead frame arrangement may be one where wire bonding is necessary to make the electrical connection between the contact pad and the lead, or a LOC arrangement where the lead of the lead frame extends over the active surface of the chip and is bonded to the contact pad with a short wire or a bump of solder. In either case, the bond required to make the connection uses an energy beam from a beam-emitting energy source to provide the energy necessary to make the connection.

In a chip/lead frame arrangement where a wire bond is used to make the electrical connection, the wire is aligned with the contact pad and the lead is subsequently bonded or fused to each using a directed energy beam. A beam of energy is focused on the site of the bond with a lens or plurality of lenses. Moreover, the wire may be directly bonded or fused to the contact pad and lead by melting the wire with the energy beam, or an energy fusible, electrically conductive bonding material may be provided proximate the bonding site.

In a preferred embodiment, the wire bonds at the contact pad and at the lead are substantially simultaneously bonded or fused. This may be accomplished by using more than one beam emitting energy source to direct more than one beam of energy, each to a different bonding site, or providing a single beam emitting energy source and splitting the beam into more than one smaller beam and directing the smaller beams to different bonding sites.

The beam emitting energy source used in conjunction with the present invention may be of various types known in the art. For example, the energy source may emit a laser beam, such as that produced by a pulsed solid state laser, a carbon dioxide laser, a Nd:YAG laser, or a Nd:YLF laser, a focused beam of light, a beam of radiant energy such as an electron beam, or a heat source, etc. In any case, the energy beam is preferably directed to the bonding site by prisms, mirrors, fiber optics, lenses and/or other reflective and/or deflective surfaces or combinations thereof. More specifically, in one preferred embodiment, each beam of energy is directed by prisms or mirrors from the energy source toward each bonding site. At least one lens is provided between each bonding site and the prisms or mirrors to further focus the beam of energy onto the bonding site. Each lens may be individually supported by a frame-like support structure or contained within an optical flat in which a plurality of lenses is formed. For a frame-like structure, the lenses may be moved and/or oriented to accommodate different chip/lead frame configurations. If the lenses are contained in an optical flat, a different optical flat may be used to accommodate various chip/lead frame configurations. In addition, the reflective and/or deflective surface may be articulatable to direct the energy beam to various bonding sites. With such an articulatable configuration, various configurations of lead frames and chips can be accommodated with the present invention.

In use, the energy beams are directed to a first set of bonding sites until the heat generated from the energy beams creates the bonds or fuses the bonds (i.e., wire bond or LOC bond) associated with the first set. The apparatus then translates the energy beams relative to the chip to a second set of bonding sites to make a second set of bonds. This process is repeated until all of the bonds associated with the chip/lead frame arrangement are formed.

An indexing system may also be associated with the apparatus to index chips, lead frames and other components into and out of the bonding location. The indexing system may comprise conveyors, articulating arms, magazines for housing the semiconductor device components, and other equipment known in the art. In addition, the entire system, from controlling the operation of the energy source to controlling which set of bonding sites are bonded to indexing the semiconductor device components, is controlled by at least one or more microprocessors.

As previously mentioned, a semiconductor chip bonded to its associated lead frame, in accordance with the present invention may have a conventional configuration where the contact pads are positioned proximate the periphery of the chip or a LOC configuration where the contact pads are positioned closer to a center line of the chip. In either case, in a preferred embodiment, a thin flexible dielectric material (foil) containing fully or partially embedded wires may be placed, at least partially, over the surface of the chip containing the contact pads and the leads of the lead frame. When properly positioned, the wires extend from the contact pads to the leads of the lead frame. The foil may be adhesively attached to the chip and/or lead frame, held in place by a slight vacuum, or retained by a suitable clamping device in order to maintain proper alignment of the wires relative to the chip and lead frame. At the ends of the each wire, an energy bondable, fusible, electrically conductive material (such as solder) may be provided for bonding the ends of the wire to the semiconductor chip and lead frame. Similarly, the energy bondable, fusible, electrically conductive material may be attached to the contact pads of the chip and/or the leads of the lead frame prior to positioning of the foil such that the energy fusible, electrically conductive material may be heated and subsequently bonded to the ends of each wire.

For a LOC configuration where the leads of the lead frame extend over the contact pads, an energy bondable, fusible, electrically conductive material (e.g., solder) may be provided between the lead and the contact pad. The solder may be bumped onto the contact pads by methods known in the art or attached to the ends of the leads to define a protuberance on the end of the lead so that when the lead frame is superimposed over the chip, the protuberance of solder is positioned above each contact pad. The solder may be bonded or fused to make the electrical connection between the leads and the contact pads by heating the leads themselves with an energy beam or providing leads that define openings through which the beam may be directed directly onto the solder. In yet another preferred embodiment, the ends of the leads themselves may be configured to contact the contact pads and may be bonded directly thereto by heating the lead.

A preferred embodiment of a semiconductor device, manufactured according to the present invention, would comprise a semiconductor chip having a plurality of contact pads, a lead frame having a plurality of leads, a foil layer or other suitable type material having a plurality of wires at least partially embedded therein, and a laser-bondable, electrically-conductive material making the electrical connections between the wires and the contact pads and leads.

Although the bonding apparatus of the present invention has been described in relation to several preferred embodiments, it is believed that a major advantage of the apparatus, according to the present invention is the efficient use of a beam emitting energy source, such as a laser, to quickly and efficiently bond a lead frame to a semiconductor chip by reducing the mechanical movements generally associated with prior art bonding apparatuses. This and other features of the invention will become apparent from the following detailed description taken in conjunction with the accompanying drawings and as defined by the appended claims.

BRIEF DESCRIPTION OF THE SEVERAL VIEWS OF THE DRAWINGS

FIG. 3A is a schematic bottom view of a wire-embedded foil according to the present invention;

FIG. 3B is a schematic side view of a wire-embedded foil shown in FIG. 3A;

FIG. 6 is a partial top view of a second embodiment of a lead of a LOC lead frame shown in FIG. 5;

FIG. 7 is a schematic side view of a third embodiment of the laser-bonding apparatus according to the present invention;

DETAILED DESCRIPTION OF THE INVENTION

Figure 1:
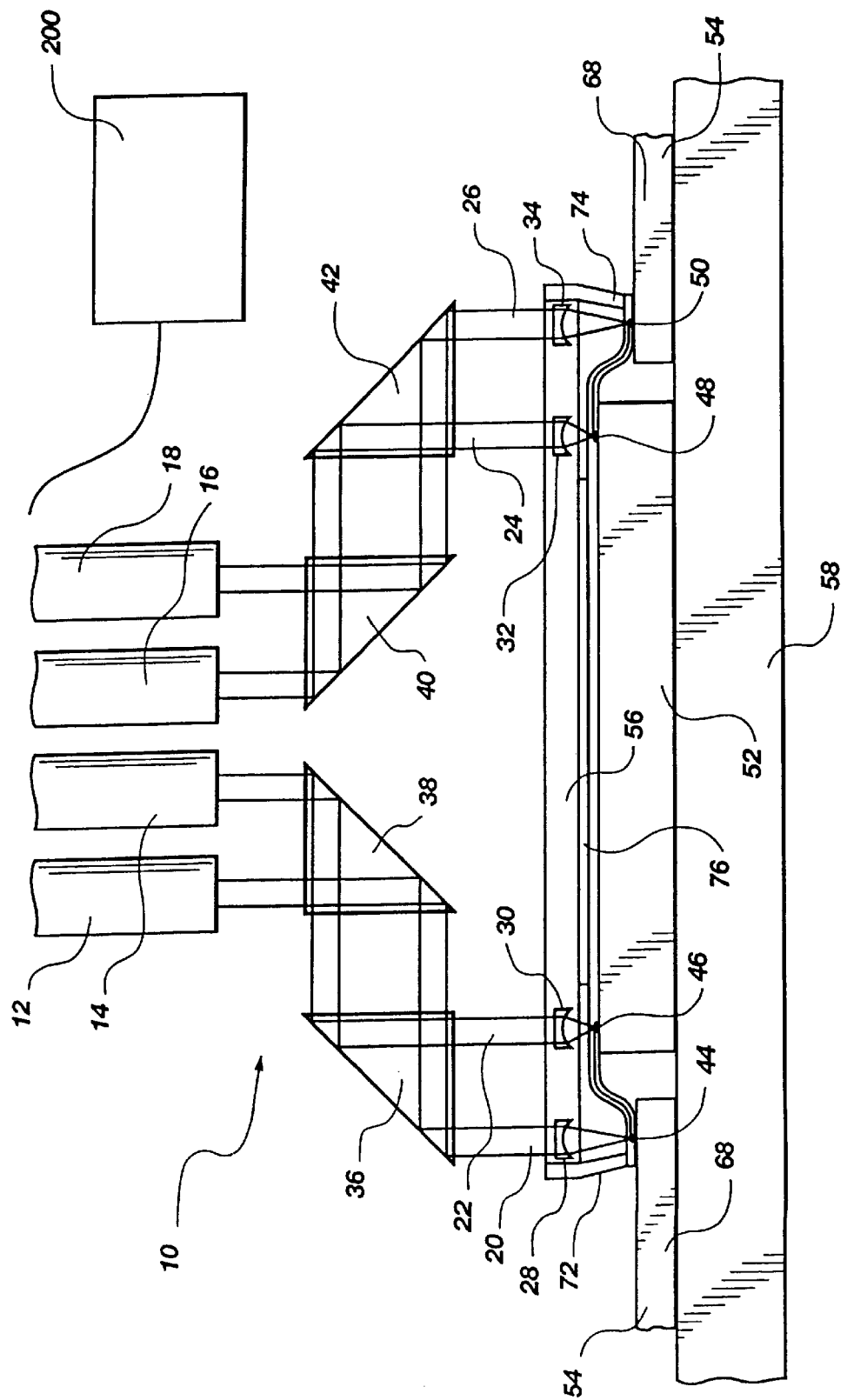
FIG. 1 is a schematic side view of a first embodiment of the laser-bonding apparatus according to the present invention.

As illustrated in FIG. 1, the laser-bonding apparatus 10 is comprised of a plurality of lasers 12, 14, 16, and 18 emitting laser beams 20, 22, 24, and 26, respectively. The laser beams 20, 22, 24, and 26 are directed toward lenses 28, 30, 32, and 34, respectively, by prisms 36, 38, 40 and 42. The lenses 28, 30, 32, and 34 focus the laser beams 20, 22, 24, and 26 onto the bonding sites 44, 46, 48, and 50, respectively, associated with the semiconductor chip 52 and lead fingers or leads 54 and 68 of a lead frame. The lenses 28, 30, 32, and 34 are formed in a frame-like structure or an optical flat 56 above each bonding site 44, 46, 48 and 50.

Figure 2:
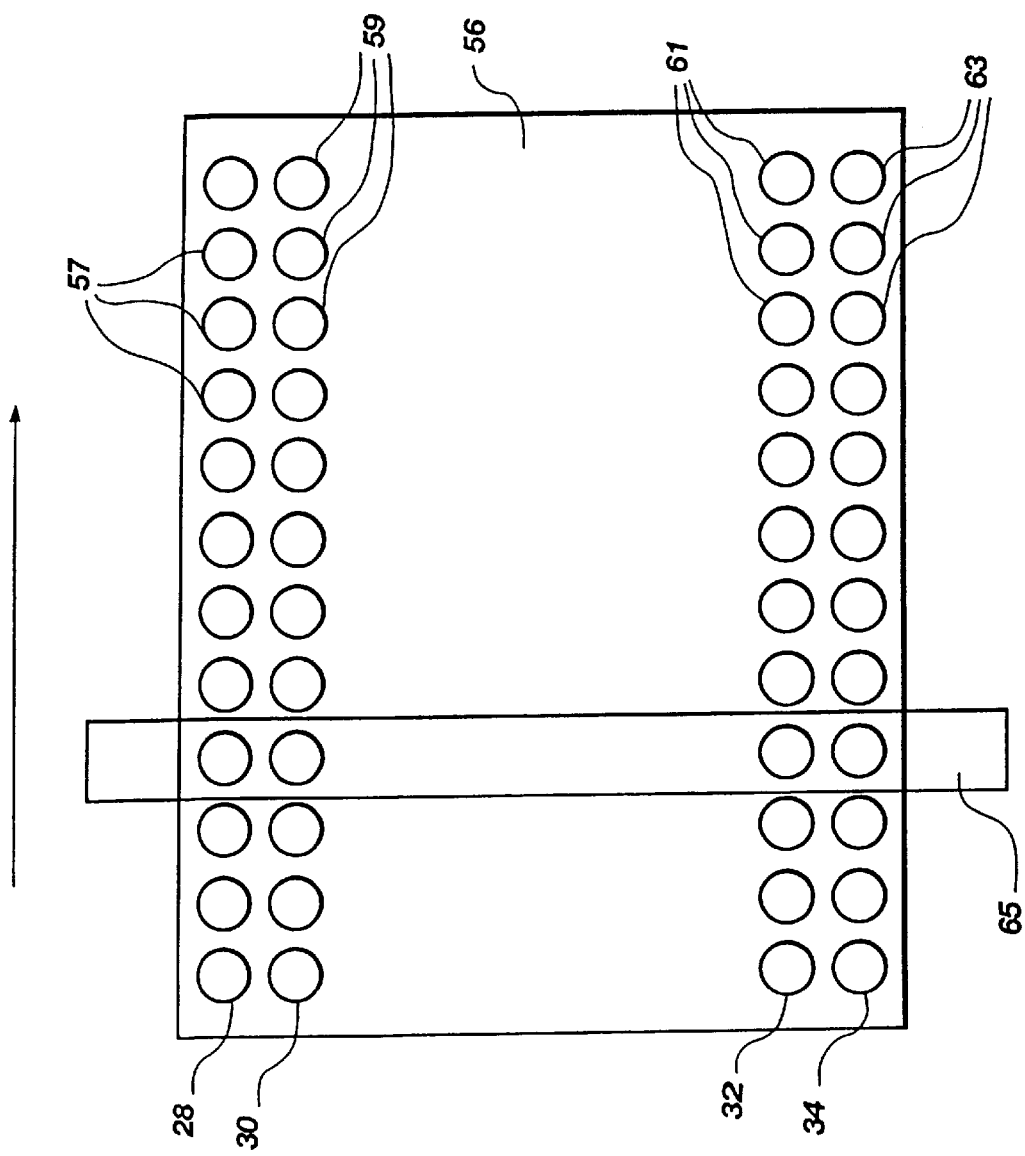
FIG. 2 is a schematic top view of an optical flat used in the laser-bonding apparatus in FIG. 1.

The optical flat 56 as shown in FIG. 2, has a plurality of lenses 57, 59, 61, and 63, such as lenses 28, 30, 32 and 34, formed in longitudinal rows along the length of the optical flat 56 corresponding to the bonding sites of a semiconductor chip 52 and lead fingers 54 and 68, such as bonding sites 44, 46, 48, and 50. As illustrated by the arrow and bar 65, the laser beams 20, 22, 24 and 26 are incrementally moved across the optical flat from one set of lenses 57, 79, 61, and 63 to the next until all of the bonds have been fused associated with a particular semiconductor chip 52 and lead fingers 54 and 68.

The semiconductor chip 52 and lead fingers 54 and 68 are supported on a platform or chip support 58. The chip support 58 may be heated so that heat generated by the laser beams 20, 22, 24, and 26 at the bonding sites 44, 46, 48, and 50 do not create such an extreme point of localized heating that could stress the chip 52 and/or the lead fingers 54 and 68. In addition, the chip support 58 may include structure as is known in the art to help align the lead fingers 54 and 68 relative to the semiconductor chip 52 and the semiconductor chip 52 relative to the rest of the laser-bonding apparatus 10.

In order to secure and align the wires 60, necessary to make wire bonds between the semiconductor chip 52 and the lead fingers 54 and 68, as illustrated in FIGS. 3A and 3B, a foil, relatively-thin dielectric material, or other suitable material 62 may be used to support a plurality of wires 60. The wires 60 may be fully or partially embedded in the foil 62 so long as the foil 62 can maintain the relative positions of the wires 60. At the end of each wire 60, an energy-bondable, fusible, electrically-conductive material 64, such as solder or other material known in the art, may also be provided to make the bond between the wires 60 and the bond sites 44, 46, 48, and 50. A flux may also be applied to the ends 66 of the wires 60 to help the wires 60 bond to the bonding sites 44, 46, 48, and 50, whether an energy-bondable, fusible, electrically conductive material 64 is used or not.

As shown in FIGS. 1 and 3B, the foil 62 is contoured to fit over the semiconductor chip 52 and extend down to the lead fingers 54 and 68 of the lead frame. This contoured shape may be formed into the foil by bending the foil to correspond to the shape of the semiconductor chip 52/lead fingers 54 and 68 configuration or may take this shape due to the foil's 62 flexible nature. Because the foil 62 is relatively thin and flexible, it may be necessary to retain the foil 62 relative to the semiconductor chip 52 and lead fingers 54 and 68 during the bonding process. Retaining the foil 62 may be accomplished by applying an adhesive to the underside 70 so that the foil 62 may be adhesively bonded to the semiconductor chip 52 and/or the lead fingers 54 and 68. In addition to or in lieu of adhesive retaining, the foil 62 may be secured during bonding by retaining members 72 and 74 that hold the foil 62 relative to the lead fingers 54 and 68 and a resilient pad 76 that holds the foil 62 in place relative to the semiconductor chip 52. Moreover, the foil 62 may be retained by providing a slight vacuum to the underside 70 of the foil 62 to draw the foil 62 onto the leads 68 and the semiconductor chip 52.

Figure 4:
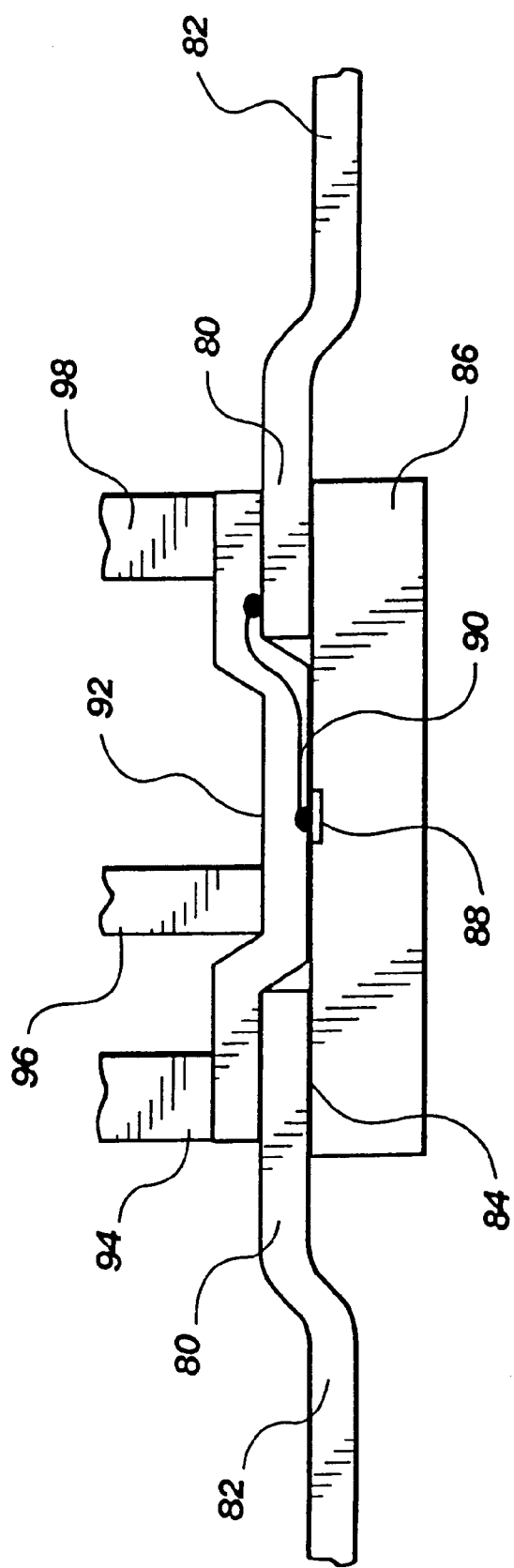
FIG. 4 is a schematic side view of a LOC configuration according to the present invention.

In addition, to a conventional semiconductor chip 52/lead fingers 54 and 68 arrangement as illustrated in FIG. 1, the laser-bonding apparatus 10 of the present invention can also be used to wire bond a LOC arrangement, as illustrated in FIG. 4, where the leads 80 of the lead frame 82 extend over the active surface 84 of the semiconductor chip 86. Typically, such a semiconductor chip 86 will have a plurality of contact pads 88 proximate the center of the semiconductor chip 86. Thus, in order to shorten the length of the wires 90 necessary to make an electrical connection between the lead 80 and the contact pad 88, the leads 80 extend over the active surface 84 proximate the contact pads 88. A foil 92 containing wires 90 may also be used to house and support the wires 90 in a similar manner to the foil 62 described in relation to FIGS. 3A and 3B. In addition, retaining members 94, 96, and 98 may also be incorporated into the laser-bonding apparatus 10 to retain the foil relative to the semiconductor chip 86 and lead frame 82 during the bonding process.

Figure 5:
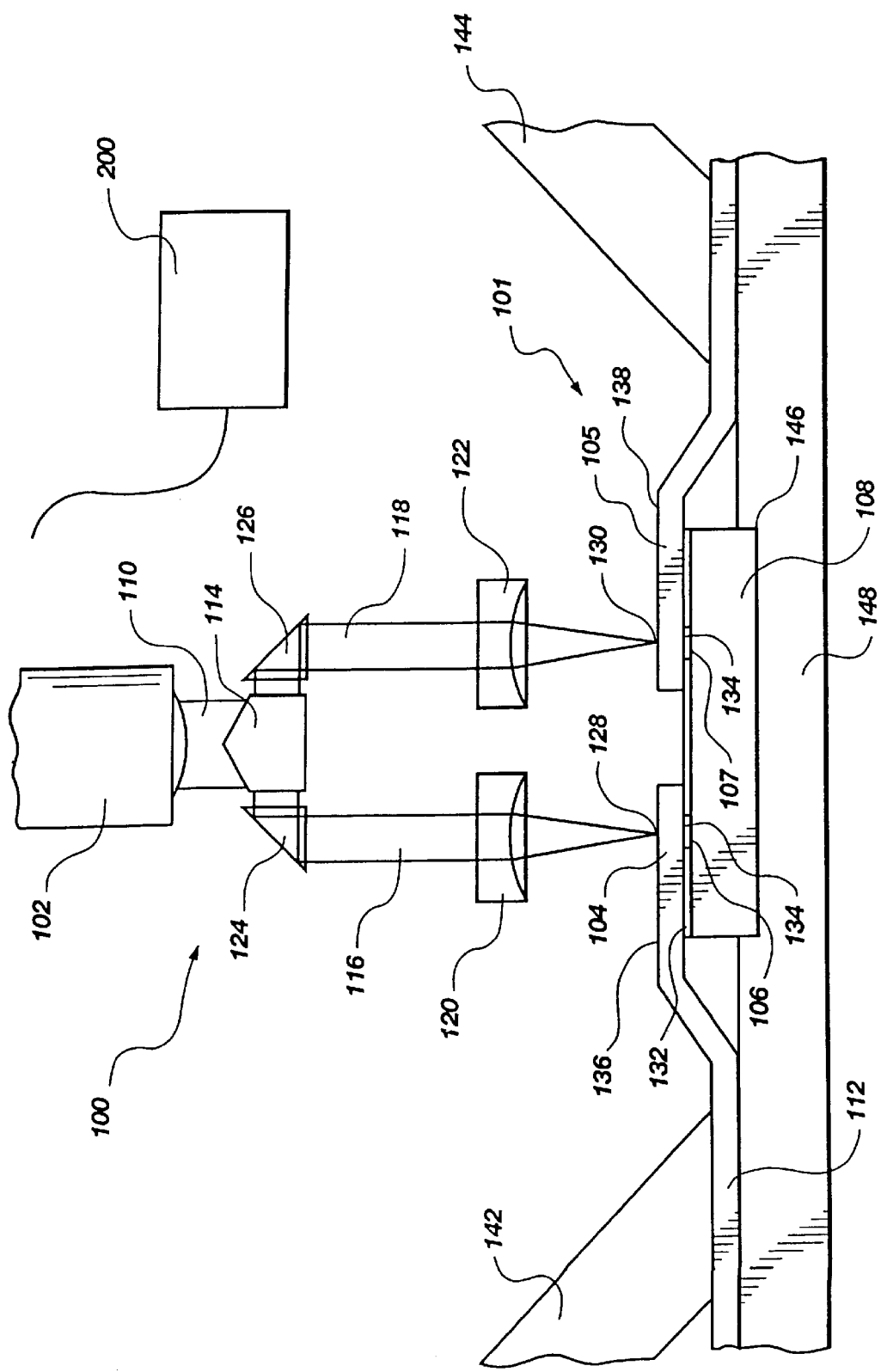
FIG. 5 is a schematic side view of a second embodiment of the laser-bonding apparatus according to the present invention.

In an alternate embodiment of the laser-bonding apparatus 100 depicted in FIG. 5, a LOC arrangement 101 is being bonded using a single laser 102. In this LOC arrangement 101, however, as opposed to that illustrated in FIG. 4, the lead fingers or leads 104 and 105 of the lead frame 112 are being bonded directly to the contact pads 106 and 107, respectively, of the chip 108. In order to substantially simultaneously bond the leads 104 and 105 to the contact pads 106 and 107, respectively, the laser beam 110 is split by a beam splitter 114, as is known in the art. The two beams 116 and 118 are directed to focusing lenses 120 and 122 by mirrors or prisms 124 and 126. The focusing lenses 120 and 122 focus the beams 116 and 118 onto the bonding sites 128 and 130. The lenses 120 and 122 may be moved to accommodate various chip/lead frame configuration and/or articulatable to direct the beams 116 and 118 to various bonding sites. The prisms 124 and 126 may also be movable and/or articulatable in the x-axis, y-axis, and z-axis.

Because the passivation layer 132 of the semiconductor chip 108 typically extends above the contact pads 106 and 107, in order to make contact with the leads 104 and 105, either a protuberance or other extension must be provided on the leads 104 and 105 or the contact pads 106 and 107 must be raised at least to the level of the passivation layer 132. If a filler material 134 is used, the filler material 134 should be conductive to provide an electrical path between the contact pads 106 and 107 and the leads 104 and 105. Moreover, the filler material 134 must be bondable or fusible by the energy provided by the beams 116 and 118. In addition, the leads 104 and 105 should be held in position relative to the passivation layer 132 by a retainer, such as clamps 142 and 144. The semiconductor chip 108 may also be held in position by a recess 146, defined by the chip support 148, sized and shaped to securely hold the semiconductor chip 108 in place during bonding.

When bonding or fusing the leads 104 and 105 to the contact pads 106 and 107, respectively, the top surfaces 136 and 138 of the leads 104 and 105, respectively, may be heated by the beams 116 and 118, or, as illustrated in FIG. 6, an aperture or opening 140 can be provided in each of the leads, such as lead 104, to expose the filler material 134 directly to the beam 116.

Referring now to FIG. 7, a plurality of fiber optics 150, 152, 154, and 156 are used to direct the laser beams 158, 160, 162, and 164 emanating from the lasers 166, 168, 170 and 172, respectively. That is, as will be recognized by those skilled in the art, there may be other ways known in the art to direct the laser beams 158, 160, 162 and 164 from the lasers 166, 168, 170 and 172 to the lenses 174, 176, 178 and 180.

In all of the preferred embodiments of bonding apparatus, according to the present invention, the manipulation of the lasers, as well as the indexing of chip components, such as the foil, die and lead frames, can be automated and controlled by one or more microprocessors 200 as is known in the art.

It should be noted that the laser source is preferably any high-power, pulsed, solid state or continuous wave laser, such as Nd:YAG, Nd:YLF, Ar-ion, $CO_2$, Cu vapor, or other suitable lasers known in the art, or a focused beam of light or a beam of energy or radiant energy, such as an electron beam or heat source. It should be recognized by those skilled in the art that the apparatus, according to the present invention may be used on any semiconductor chip and associated lead frame having either conventional configurations as is known in the art or a specialized arrangement. Those skilled in the art will also appreciate that the number of lasers and beams therefrom may be increased or decreased depending on the number of wire bonds to be formed at substantially the same time. Further, the invention may be practiced on many semiconductor devices where wire bonding or LOC bonding is desired, such as bonding a chip to a printed circuit board. Thus, the terms "chip" and "lead frame", as used herein, are intended as exemplary and not limiting, the invention having applicability to any semiconductor-related structure employing a wire bond or a LOC-type bond. It will also be appreciated by one of ordinary skill in the art that one or more features of any of the illustrated embodiments may be combined with one or more features from another to form yet another combination within the scope of the invention as described and claimed herein. Thus, while certain representative embodiments and details have been shown for purposes of illustrating the invention, it will be apparent to those skilled in the art that various changes in the invention disclosed herein may be made without departing from the scope of the invention, which is defined in the appended claims.

What is claimed is:

1. A semiconductor device bonding apparatus comprising:
   a chip support located at a bonding station;
   at least one energy source providing a plurality of energy beams; and
   an optical structure mounted in a path of said plurality of energy beams for directing said plurality of energy beams toward a plurality of bonding sites of a chip component at said chip support.

2. The bonding apparatus of claim 1, wherein a bonding site of said chip component includes a contact pad of a semiconductor die.

3. The bonding apparatus of claim 1, wherein a bonding site of said plurality of bonding sites of said chip component includes a lead of a lead frame.

4. The bonding apparatus of claim 1, wherein said at least one energy source includes a plurality of energy beam emitters, each directing at least one energy beam of said plurality of energy beams toward a different bonding site of said plurality of bonding sites.

5. The bonding apparatus of claim 1, wherein said optical structure includes at least one reflective surface mounted thereon.

6. The bonding apparatus of claim 5, wherein said at least one reflective surface includes a movable reflective surface.

7. The bonding apparatus of claim 5, wherein said at least one reflective surface includes translatable reflective surface.

8. The bonding apparatus of claim 5, wherein said at least one reflective surface includes at least one prism.

9. The bonding apparatus of claim 5, wherein said at least one reflective surface includes at least one mirror.

10. The bonding apparatus of claim 1, wherein said optical structure includes at least one fiber optic segment mounted in a path of at least one of said plurality of energy beams.

11. The bonding apparatus of claim 1, wherein said optical structure includes at least one beam splitter mounted in a path of at least one of said plurality of energy beams.

12. The bonding apparatus of claim 1, wherein said optical structure includes at least one lens mounted in a path of at least one of said plurality of energy beams.

13. The bonding apparatus of claim 1, wherein said optical structure includes at least one articulatable lens.

14. The bonding apparatus of claim 1, wherein said optical structure includes at least one optical flat mounted in a path of at least one of said plurality of energy beams, said at least one optical flat comprising a plurality of lenses, each lens of said plurality of lenses positioned to focus said at least one energy beam of said plurality of energy beams on said plurality of bonding sites.

15. The bonding apparatus of claim 14, wherein said at least one of said plurality of energy beams is movable relative to said at least one optical flat directing at least one of said plurality of energy beams through more than one of said plurality of lenses.

16. The bonding apparatus of claim 1, further including a chip indexer to index at least one semiconductor die and at least one lead frame at said chip support.

17. The bonding apparatus of claim 1, wherein said at least one energy source includes a translatable energy source relative to at least one of said plurality of bonding sites of said chip component.

18. The bonding apparatus of claim 4, wherein said plurality of energy beam emitters includes lasers.

19. The bonding apparatus of claim 18, wherein said lasers includes a group comprising pulsed, solid state lasers, carbon dioxide lasers, Nd:YAG lasers, or Nd:YLF laser.

20. The bonding apparatus of claim 1, wherein said at least one energy source includes a light source.

21. The bonding apparatus of claim 1, wherein said at least one energy source includes a heat source.

22. The bonding apparatus of claim 1, further including at least one microprocessor for controlling said semiconductor device bonding apparatus.

23. A semiconductor device bonding apparatus for bonding a plurality of conductors to a plurality of semiconductor device bonding sites on a semiconductor chip, said bonding apparatus comprising:
   a chip support located at a bonding location;
   at least one energy source providing a plurality of energy beams; and an optical structure directing said plurality of energy beams toward said plurality of bonding sites on said semiconductor chip.

24. The bonding apparatus of claim 23, wherein a bonding site of said plurality of bonding sites of said semiconductor chip includes a contact pad of a semiconductor die.

25. The bonding apparatus of claim 23, wherein a bonding site of said plurality of bonding sites of said semiconductor chip includes a lead of a lead frame.

26. The bonding apparatus of claim 23, wherein said at least one energy source includes a plurality of energy beam emitters, each energy beam emitter of said plurality of energy beam emitters directing at least one of said plurality of energy beams toward a bonding site of said plurality of bonding sites.

27. The bonding apparatus of claim 23, wherein said optical structure includes at least one reflective surface.

28. The bonding apparatus of claim 27, wherein said at least one reflective surface includes an articulatable reflective surface.

29. The bonding apparatus of claim 27, wherein said at least one reflective surface includes a translatable reflective surface.

30. The bonding apparatus of claim 27, wherein said at least one reflective surface includes at least one prism.

31. The bonding apparatus of claim 27, wherein said at least one reflective surface includes at least one mirror.

32. The bonding apparatus of claim 23, wherein said optical structure includes at least one fiber optic segment mounted in a path of at least one of said plurality of energy beams.

33. The bonding apparatus of claim 23, wherein said optical structure includes at least one beam splitter mounted in a path of at least one of said plurality of energy beams.

34. The bonding apparatus of claim 23, wherein said optical structure includes at least one lens mounted in a path of at least one of said plurality of energy beams.

35. The bonding apparatus of claim 23, wherein said optical structure includes at least one articulatable lens.

36. The bonding apparatus of claim 23, wherein said optical structure includes at least one optical flat mounted in a path of at least one of said plurality of energy beams, said at least one optical flat including a plurality of lenses, each positioned to focus said at least one of said plurality of energy beams on said plurality of bonding sites.

37. The bonding apparatus of claim 36, wherein said at least one energy beam moves relative to said at least one optical flat so that said at least one of said plurality of energy beams may be directed through more than one of said plurality of lenses.

38. The bonding apparatus of claim 23, further including a chip indexer for indexing at least one semiconductor die and at least one lead frame to and from said chip support.

39. The bonding apparatus of claim 23, wherein said at least one energy source translates relative to at least one bonding site of said semiconductor chip.

40. The bonding apparatus of claim 26, wherein said plurality of energy beam emitters includes lasers.

41. The bonding apparatus of claim 40, wherein said lasers includes a group comprising pulsed, solid state lasers, carbon dioxide lasers, Nd:YAG lasers, or Nd:YLF laser.

42. The bonding apparatus of claim 23, wherein said at least one energy source includes a light source.

43. The bonding apparatus of claim 23, wherein said at least one energy source includes a heat source.

44. The bonding apparatus of claim 23, further including at least one microprocessor for controlling said bonding apparatus.

* * * * *

UNITED STATES PATENT AND TRADEMARK OFFICE
CERTIFICATE OF CORRECTION

| | | |
|---|---|---|
| PATENT NO. | : 6,211,053 B1 | Page 1 of 1 |
| APPLICATION NO. | : 09/344678 | |
| DATED | : April 3, 2001 | |
| INVENTOR(S) | : Sven Evers | |

It is certified that error appears in the above-identified patent and that said Letters Patent is hereby corrected as shown below:

In the specification:

COLUMN 5, LINE 40, change "chip 52" to --semiconductor chip 52--

Signed and Sealed this

Fourth Day of September, 2007

JON W. DUDAS
*Director of the United States Patent and Trademark Office*